United States Patent
Gao et al.

(10) Patent No.: US 9,741,753 B2
(45) Date of Patent: Aug. 22, 2017

(54) ARRAY SUBSTRATE AND MANUFACTURING METHOD THEREOF, AND DISPLAY APPARATUS THEREOF

(71) Applicants: BOE Technology Group Co., Ltd., Beijing (CN); Hefei Xinsheng Optoelectronics Technology Co., Ltd., Hefei (CN)

(72) Inventors: Jilei Gao, Beijing (CN); Xuebing Jiang, Beijing (CN); Jian Zhao, Beijing (CN)

(73) Assignees: BOE Technology Group Co., Ltd., Beijing (CN); Hefei Xinsheng Optoelectronics Technology Co., Ltd., Hefei (CN)

( * ) Notice: Subject to any disclaimer, the term of this patent is extended or adjusted under 35 U.S.C. 154(b) by 0 days.

(21) Appl. No.: 15/189,645

(22) Filed: Jun. 22, 2016

(65) Prior Publication Data

US 2017/0084640 A1    Mar. 23, 2017

(30) Foreign Application Priority Data

Sep. 17, 2015 (CN) .......................... 2015 1 0592156

(51) Int. Cl.
| | |
|---|---|
| *H01L 21/00* | (2006.01) |
| *H01L 27/15* | (2006.01) |
| *H01L 27/146* | (2006.01) |
| *H01L 27/148* | (2006.01) |
| *H01L 27/32* | (2006.01) |
| *H01L 23/00* | (2006.01) |

(52) U.S. Cl.
CPC ........ *H01L 27/14603* (2013.01); *H01L 24/05* (2013.01); *H01L 24/08* (2013.01); *H01L 27/14812* (2013.01); *H01L 27/3248* (2013.01)

(58) Field of Classification Search
CPC .................... H01L 27/14603; H01L 27/14812
USPC ....................................... 257/84; 438/23, 39
See application file for complete search history.

(56) References Cited

U.S. PATENT DOCUMENTS

| | | | |
|---|---|---|---|
| 2004/0125293 A1* | 7/2004 | Cheng ............... | G02F 1/133514 349/122 |
| 2011/0111543 A1* | 5/2011 | Ono ...................... | H01L 27/124 438/42 |
| 2016/0327841 A1* | 11/2016 | Jia .......................... | G02F 1/133 27/296 |

* cited by examiner

*Primary Examiner* — Calvin Lee
(74) *Attorney, Agent, or Firm* — Banner & Witcoff, Ltd.

(57) ABSTRACT

An embodiment of the present disclosure provides an array substrate and a manufacturing method thereof and a display apparatus. The array substrate includes a base substrate, wherein, the base substrate is provided with a bonding region; a bonding pad and a first bonding lead connected with the bonding pad and extending to an edge of the base substrate are provided in the bonding region, and one or more metal patterns are arranged above the first bonding lead, the one or more metal patterns crossing over the first bonding lead and being insulated from the first bonding lead.

20 Claims, 3 Drawing Sheets

ARRAY SUBSTRATE AND MANUFACTURING METHOD THEREOF, AND DISPLAY APPARATUS THEREOF

This application claims priority to and the benefit of Chinese Patent Application No. 201510592156.8 filed on Sep. 17, 2015, which application is incorporated herein in its entirety.

TECHNICAL FIELD

Embodiments of the present disclosure relate to an array substrate and a manufacturing method thereof, and a display apparatus.

BACKGROUND

A thin film transistor liquid crystal display (TFT-LCD) has advantages of small size, low power consumption, low manufacturing cost and the like, and is mainly formed by cell-assembling a color filter (CF) substrate and an array substrate, wherein, in order to input an external display signal, the array substrate is usually provided with a bonding region. Generally, a plurality of external lines in parallel are formed on the array substrate, and a precise circuit signal input can be performed by a chip on film (COF) process or a drive IC bonding process.

SUMMARY

An embodiment of the present disclosure provides an array substrate, including a base substrate, wherein, the base substrate is provided with a bonding region, a bonding pad and a first bonding lead connected with the bonding pad and extending to an edge of the base substrate are provided in the bonding region, and one or more metal patterns are arranged above the first bonding lead, the one or more metal patterns crossing over the first bonding lead and being insulated from the first bonding lead.

Another embodiment of the present disclosure provides a display apparatus, including the above described array substrate.

Yet another embodiment of the present disclosure provides a manufacturing method of an array substrate, including: forming a bonding pad and a first bonding lead connected with the bonding pad and extending to an edge of the base substrate in a bonding region of a base substrate, and forming one or more metal patterns above the first bonding lead, the one or more metal patterns crossing over the first bonding lead and being insulated from the first bonding lead.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Hereinafter, in conjunction with the drawings and embodiments, specific embodiments of the present disclosure are described in further detail. The following embodiments are intended to describe the present disclosure rather than limiting a scope of the present disclosure.

Figure 1:
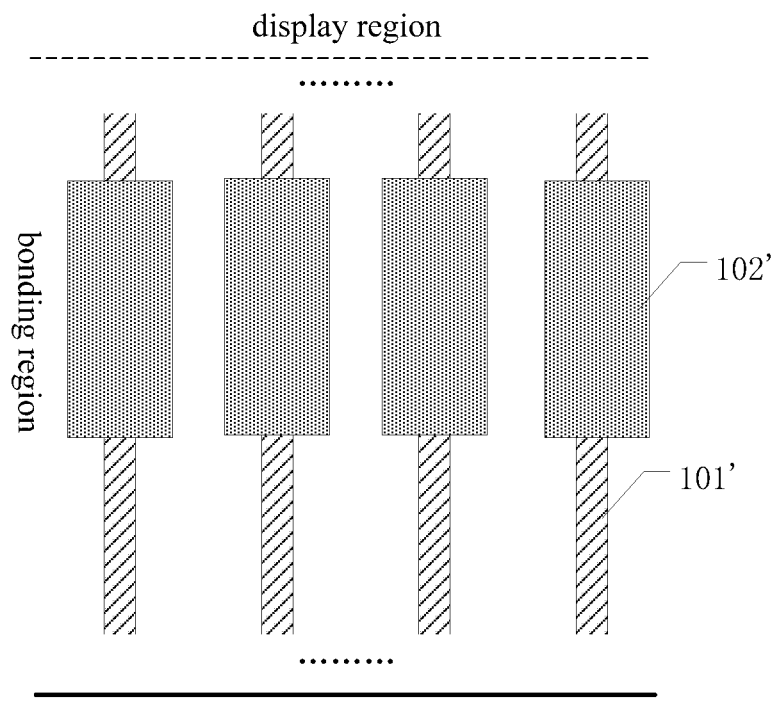
FIG. 1 is a schematic diagram of an array substrate in prior art.

A bonding region of an array substrate in a related art is as shown in FIG. 1. Each external line comprises a bonding pad 102' and a bonding lead 101'. However, due to process and other reasons, during a bonding or COF removing process, a large number of the bonding leads fall off form an edge of the substrate (glass), and the falling off extend to the bonding pad, such that a lot of line defects are caused in resulted products and a circuit signal cannot be normally input.

One of technical problems to be solved by an embodiment of the present invention is avoid bonding pads and bonding leads in a bonding region of an array substrate from falling off.

An embodiment of the present disclosure provides an array substrate including a base substrate. The base substrate is provided with a bonding region. The bonding region is provided with a bonding pad and a bonding lead connected with the bonding pad and extending to an edge direction of the base substrate. A metal pattern is arranged above the bonding lead. The metal pattern crosses over the bonding lead and is insulated from the bonding lead.

In the array substrate provided by the embodiment of the present disclosure, the metal pattern is arranged above the bonding leads to across the bonding leads. By using the metal pattern, the bonding leads below can be reinforced, and falling off of the bonding leads and the bonding pad can be effectively reduced.

Figure 2:
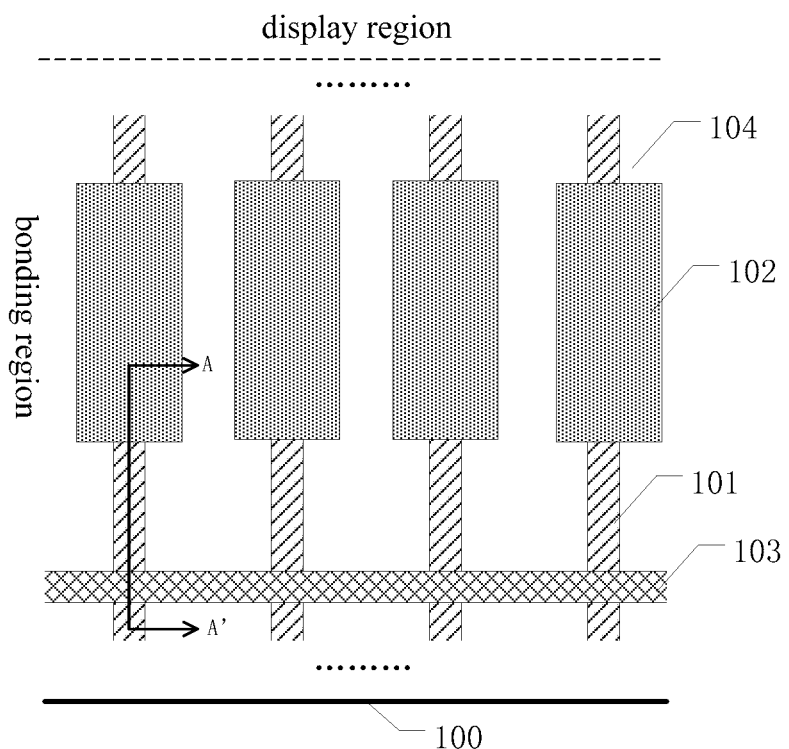
FIG. 2 is a schematic diagram of an array substrate provided by an embodiment of the present disclosure.

FIG. 2 is a schematic diagram of an array substrate provided by an embodiment of the present disclosure. Referring to FIG. 2, the array substrate comprises a base substrate 100; the base substrate 100 is provided with a display region and a bonding region located around the display region, wherein the bonding region is provided with a plurality of externally connected circuits, each of which includes a bonding pad 102 and a bonding lead 101 extending to an edge of the base substrate. A strip-shaped metal pattern 103 cross over the plural bonding leads in parallel and is insulated from the plural bonding leads. The strip-shaped metal pattern 103 is located on a side of the bonding pads 102 opposite to the display region. By the strip-shaped metal pattern, the bonding leads therebelow can be reinforced.

Figure 3:
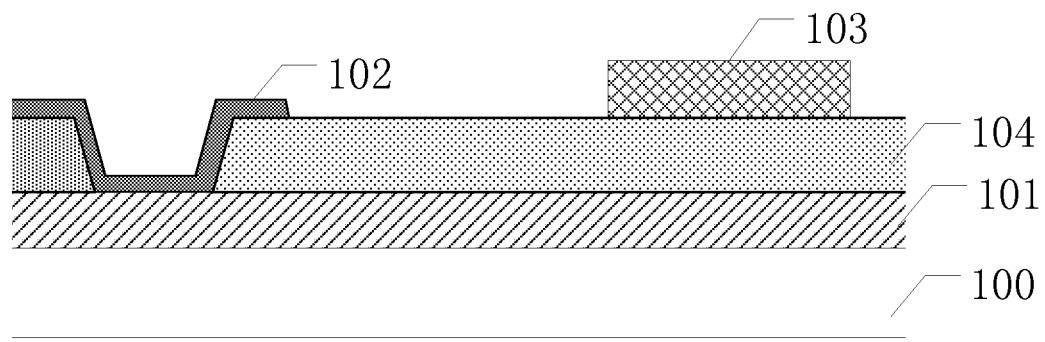
FIG. 3 is a sectional schematic diagram along an AA' direction in FIG. 2.

FIG. 3 is a sectional schematic diagram along an AA' direction in FIG. 2. As shown in FIG. 3, the bonding leads 101, an insulating layer 104 and a metal pattern 103 are arranged on the base substrate 100 in sequence, and the bonding pads 102 are electrically connected with the bonding leads 101 through via holes in the insulating layer 102 respectively.

In addition, in the display region, the base substrate is provided with gate lines, a gate insulating layer (GI insulating layer), data lines and a passivation layer (PVX layer) in sequence. For example, in order to reduce a manufacturing cost, the foregoing structures in the bonding region can be formed simultaneously with the foregoing structures in the display region.

For example, the bonding leads 101 can be formed in a same patterning process as the gate lines in the display region, that is, in the process of manufacturing the gate lines of the display region, a metal thin film for the gate lines is configured to form the bonding leads in the bonding region; after the patterning process, the bonding leads and the gate line are made of a same material and in a same layer.

The metal pattern 103 can be formed in a same patterning process as the data lines in the display region, that is, in the process of manufacturing the data lines of the display region, a metal thin film for the data lines is configured to form the metal pattern 103 in the bonding region; after the patterning process, the metal pattern and the data lines are made of a same material and in a same layer.

The insulating layer 104 can be formed in a same patterning process as the gate insulating layer in the display region, that is, during the manufacturing of the gate insulating layer, the gate insulating layer can extend to a position between the bonding leads and the metal pattern to insulate the bonding leads from the metal pattern.

The bonding pads 102 can be formed in a same patterning process as a pixel electrode in the display region, that is, in the process of manufacturing the pixel electrode of the display region, a transparent conductive thin film (for example ITO) for the pixel electrode is configured to form the bonding pads 102 in the bonding region.

Figure 4:
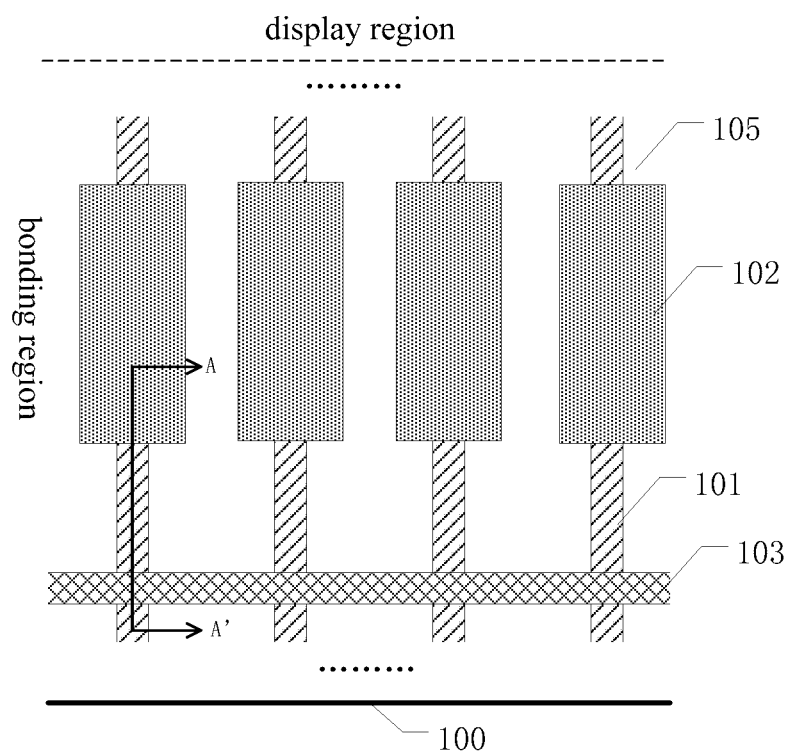
FIG. 4 is a schematic diagram of another array substrate provided by an embodiment of the present disclosure.
Figure 5:
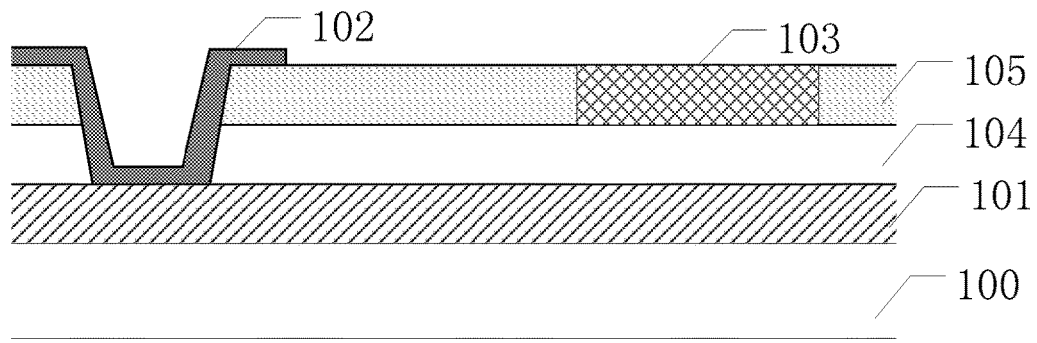
FIG. 5 is a sectional schematic diagram along an AA' direction in FIG. 4.

For example, in order to further improve flatness of the bonding region, as for the above array substrate, the passivation layer extends from the display region to a region of the bonding region without the metal pattern so as to solve the poor flatness problem caused by the metal pattern. FIG. 4 is a schematic diagram of another array substrate provided by an embodiment of the present disclosure, the bonding region of the array substrate as shown in FIG. 4 is substantially the same as the bonding region of the array substrate as shown in FIG. 2 in structure, except that the passivation layer extends from the display region to a region of the bonding region around the metal pattern 103 so as to improve the surface flatness in the array substrate shown in FIG. 4. Correspondingly, as shown in FIG. 5 which is a sectional schematic diagram along an AA' direction in FIG. 4, a via hole is formed in a position of the passivation layer 105 in the bonding region corresponding to the bonding pad, so that the bonding pad 102 can be electrically connected with the bonding lead 101.

For example, as for the above array substrate, the gate lines are firstly formed in the display region, and then the bonding leads are formed in the bonding region, the gate insulating layer is formed in the display region and extends to the bonding region; after the gate insulating layer is manufactured, the data lines are formed on the display region, a transverse cross-over metal (metal pattern) is formed above the bonding leads and close to the edge of the substrate (glass), and then the passivation layer is formed in the display region and extends to the bonding region. For example, in order to ensure the flatness during bonding, the passivation layer above the metal pattern can be etched, and then the via holes are provided in the position of the gate insulating layer and the passivation layer corresponding to the bonding pads, so that the bonding pads subsequently formed can be electrically connected with the bonding leads respectively.

Figure 6:
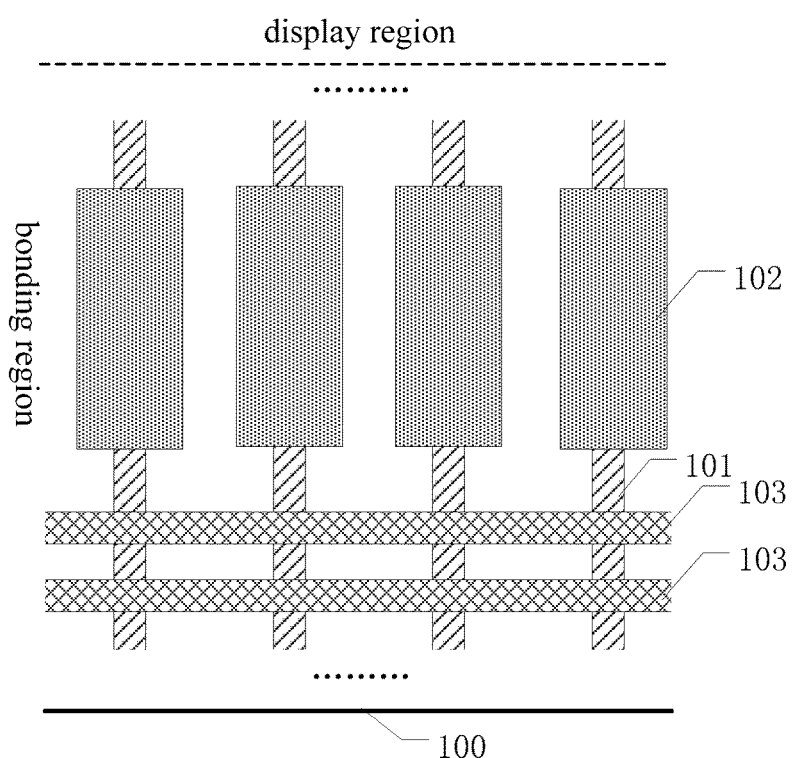
FIG. 6 is a schematic diagram of another array substrate according to an embodiment of the present disclosure.

For example, in order to further improve the adhesion stability of the bonding leads, a plurality of parallel metal patterns 13 are arranged in the bonding region as shown in FIG. 6.

In addition, in the embodiment of the present disclosure, the metal pattern for reinforcing the bonding leads can not only be formed in a region without the bonding pads as shown in FIG. 2 and FIG. 4, but also be formed in a position with the bonding pads. For example, as for the structure as shown in FIG. 5, the metal pattern for reinforcing can be formed below the bonding pad and between the passivation layer 105 and the insulating layer 4 as long as the metal pattern and the bonding pad are insulated from each other.

The bonding pad can be a gate pad for inputting a signal to a gate line of the array substrate; in such case, the bonding lead below the bonding pad can be electrically connected with the gate line in the display region; the bonding pad can also be a data pad for inputting a signal to a data line of the array substrate, and in such case, the bonding lead below the bonding pad can be electrically connected with the data line in the display region.

According to the array substrate provided by the embodiment of the present disclosure, the metal pattern is arranged above and across the bonding lead and is close to the edge of the substrate in the bonding region. During a bonding or COF removing operation, the falling off phenomenon of the bonding leads and the bonding pads is greatly reduced, a production yield and repair rate are improved, various defects caused by falling off of the bonding pad and the bonding lead are avoided. The additional metal pattern in the present disclosure will not form short circuit with the gate line, and a test on an array substrate can still be performed before the cutting or laser trimming process without affecting a normal production flow.

An embodiment of the present disclosure further provides a display apparatus, comprising the above array substrate and an opposed substrate bonded with the array substrate. The display apparatus provided according to the embodiment of the present disclosure can be a laptop display screen, a liquid crystal display, a liquid crystal television, a digital photo frame, a cellphone, a tablet computer and any other products or parts with a display function.

An embodiment of the present disclosure further provides a manufacturing method of an array substrate, including: forming a bonding pad and a bonding lead connected with the bonding pad and extending to an edge direction of a substrate in a bonding region of the base substrate, and forming a metal pattern above the bonding lead, the metal pattern crossing over the bonding lead and being insulated from the bonding lead.

For example, the metal pattern is strip-shaped, and an extending direction thereof is vertical to that of the bonding lead. For example, the same one metal pattern crosses over plural bonding leads.

For example, the metal patterns in parallel are formed in the bonding region.

For example, the method further includes: forming gate lines, a gate insulating layer, data lines and a passivation layer in a display region of the base substrate in sequence, wherein the bonding lead and the gate lines are formed in a same patterning process, the metal pattern and the data lines are formed in a same patterning process, and the gate insulating layer extends to a position between the bonding lead and the metal pattern to insulate the bonding lead from the metal pattern.

For example, the passivation layer extends to a region of the bonding region without the metal pattern.

Although the embodiments of the disclosure has been described above in great detail with general descriptions and specific embodiments, on the basis of the embodiment of the disclosure, various changes and improvements may be made, which is apparent to those skilled in the art. Therefore, all such changes and improvements without departing from the spirit of the disclosure are within the scope of the claims of the disclosure.

The application claims priority of Chinese Patent Application No. 201510592156.8 filed on Sep. 17, 2015, the disclosure of which is incorporated herein by reference in its entirety as part of the present application.

The invention claimed is:

1. A manufacturing method of an array substrate, comprising: forming a bonding pad and a first bonding lead, connected with the bonding pad and extending to an edge of a base substrate, in a bonding region of the base substrate, and forming one or more metal patterns above the first bonding lead, the one or more metal patterns crossing over the first bonding lead and being insulated from the first bonding lead.

2. The manufacturing method of the array substrate according to claim 1, wherein the base substrate is further provided with a display region, the bonding region is located around the display region, and the one or more metal patterns are located on a side of the bonding pad opposite to the display region.

3. The manufacturing method of the array substrate according to claim 1, further comprising: forming gate lines, a gate insulating layer, data lines and a passivation layer in a display region of the base substrate, wherein,
the bonding region is located around the display region,
the first bonding lead and the gate lines are formed by a same patterning process,
the one or more metal patterns and the data lines are formed by a same patterning process, and
the gate insulating layer extends to a position between the first bonding lead and the one or more metal patterns to insulate the first bonding lead from the one or more metal patterns.

4. The manufacturing method of the array substrate according to claim 3, wherein, the passivation layer extends to a region of the bonding region without the one or more metal patterns.

5. The manufacturing method of the array substrate according to claim 1, wherein, the one or more metal patterns are strip-shaped.

6. The manufacturing method of the array substrate according to claim 5, wherein the metal patterns are parallel with each other.

7. The manufacturing method of the array substrate according to claim 5, wherein, an extending direction of the one or more metal patterns is vertical to that of the first bonding lead.

8. The manufacturing method of the array substrate according to claim 7, further, comprising: forming a plurality of second bonding leads parallel with the first bonding lead and located in a same layer as the first bonding lead in the bonding region, wherein, the one or more metal patterns cross over the first bonding lead and the second bonding leads, and the one or more metal patterns are insulated from the second bonding leads.

9. An array substrate, comprising:
a base substrate, provided with a bonding region;
a bonding pad and a first bonding lead, connected with the bonding pad and extending to an edge of the base substrate, provided in the bonding region; and
one or more metal patterns arranged above the first bonding lead, the one or more metal patterns crossing over the first bonding lead and being insulated from the first bonding lead.

10. The array substrate according to claim 9, wherein the base substrate is further provided with a display region, the bonding region is located around the display region, and the one or more metal patterns are located on a side of the bonding pad opposite to the display region.

11. A display apparatus, comprising the array substrate according to claim 9.

12. The array substrate according to claim 9, wherein the base substrate is further provided with a display region, the bonding region is located around the display region, the display region includes gate lines, a gate insulating layer, data lines and a passivation layer sequentially arranged on the base substrate, the first bonding lead and the gate lines are made of a same material and arranged in a same layer, the one or more metal patterns and the data lines are made of a same material and arranged in a same layer, and the gate insulating layer extends to a position between the first bonding lead and the one or more metal patterns to insulate the first bonding lead from the one or more metal patterns.

13. The array substrate according to claim 12, wherein the passivation layer further extends to a region of the bonding region without the one or more metal patterns.

14. The array substrate according to claim 9, wherein the one or more metal patterns are strip-shaped.

15. The array substrate according to claim 14, wherein, the base substrate is further provided with a display region, the bonding region is located around the display region, and the one or more metal patterns are located on a side of the bonding pad opposite to the display region.

16. The array substrate according to claim 14, wherein the metal patterns are parallel with each other.

17. The array substrate according to claim 14, wherein an extending direction of the one or more metal patterns is vertical to that of the first bonding lead.

18. The array substrate according to claim 17, wherein the metal patterns are parallel with each other.

19. The array substrate according to claim 17, wherein the bonding region is further provided with a plurality of second bonding leads parallel with the first bonding lead and located in a same layer as the first bonding lead, the one or more metal patterns cross over the first bonding lead and the second bonding leads, and the one or more metal patterns are insulated from the second bonding leads.

20. The array substrate according to claim 19, wherein the metal patterns are parallel with each other.

* * * * *